(12) United States Patent
Reese et al.

(10) Patent No.: US 10,705,228 B2
(45) Date of Patent: Jul. 7, 2020

(54) PHOTO SENSOR FOR USE AS A RADIATION DETECTOR AND POWER SUPPLY AND METHOD FOR MAKING AND USING THE DEVICE

(71) Applicant: Oregon State University, Corvallis, OR (US)

(72) Inventors: Steven R. Reese, Corvallis, OR (US); Kendon R. Shirley, Corvallis, OR (US); Abdulsalam M. Alhawsawi, Corvallis, OR (US)

(73) Assignee: Oregon State University, Corvallis, OR (US)

( * ) Notice: Subject to any disclaimer, the term of this patent is extended or adjusted under 35 U.S.C. 154(b) by 666 days.

(21) Appl. No.: 14/742,380

(22) Filed: Jun. 17, 2015

(65) Prior Publication Data

US 2015/0369928 A1 Dec. 24, 2015

Related U.S. Application Data

(60) Provisional application No. 62/013,841, filed on Jun. 18, 2014.

(51) Int. Cl.
*G01T 1/20* (2006.01)
*H01L 51/00* (2006.01)
(Continued)

(52) U.S. Cl.
CPC .............. *G01T 1/2018* (2013.01); *G01T 1/24* (2013.01); *G01T 1/241* (2013.01);
(Continued)

(58) Field of Classification Search
CPC ......... G01T 1/2018; G01T 1/241; G01T 1/24; Y10T 29/49156; H01L 51/0045; H01L 51/42; H01L 51/4206; H01L 51/445
(Continued)

(56) References Cited

U.S. PATENT DOCUMENTS 7,495,223 B2 2/2009 Shimoi et al.
7,977,640 B2 7/2011 Bush
(Continued)

OTHER PUBLICATIONS

Ci et al., "Atomic layers of hybridized boron nitride and graphene domains," *Nature Materials* 9(5):430-435, May 2010.

*Primary Examiner* — David P Porta
*Assistant Examiner* — Carolyn Fin
(74) *Attorney, Agent, or Firm* — Klarquist Sparkman, LLP

(57) ABSTRACT

An apparatus is disclosed herein comprising one or more optically reflective materials, one or more electrodes, one or more photodetecting materials, and one or more substrates. At least one optically reflective material is electrically insulating, and the electrodes are positioned adjacent to the insulating optically reflective material. Additionally, the photodetecting materials are positioned on the substrates and are adjacent to the one or more electrodes. A method is disclosed comprising providing one or more photodetecting materials positioned on one or more substrates, placing one or more electrodes adjacent to the photodetecting materials, and placing one or more optically reflective materials adjacent to the electrodes and/or substrate. At least one optically reflective material is electrically insulating, and the insulating optically reflective material is placed adjacent to the electrodes. A method is also disclosed comprising providing an apparatus as above and using the apparatus.

29 Claims, 10 Drawing Sheets

(51) Int. Cl.
  H01L 51/42    (2006.01)
  H01L 51/44    (2006.01)
  G01T 1/24     (2006.01)

(52) U.S. Cl.
  CPC .......... H01L 51/0045 (2013.01); H01L 51/42 (2013.01); H01L 51/4206 (2013.01); H01L 51/445 (2013.01); *Y10T 29/49156* (2015.01)

(58) Field of Classification Search
  USPC ............................................ 250/362, 370.11
  See application file for complete search history.

(56) References Cited

U.S. PATENT DOCUMENTS

| | | |
|---|---|---|
| 8,581,188 B2 | 11/2013 | Barbi et al. |
| 2010/0224785 A1 | 9/2010 | Chiyoma et al. |
| 2012/0001761 A1 | 1/2012 | Voutilainen et al. |
| 2013/0009069 A1 | 1/2013 | Okada |
| 2013/0193404 A1 | 8/2013 | Koppens et al. |
| 2013/0248724 A1 | 9/2013 | Kawata et al. |
| 2013/0324844 A1 | 12/2013 | Knowland et al. |
| 2014/0001365 A1 | 1/2014 | Akers et al. |
| 2014/0015082 A1 | 1/2014 | Kawanishi et al. |
| 2016/0004298 A1* | 1/2016 | Mazed .................... G06F 3/011 345/633 |
| 2017/0141302 A1* | 5/2017 | Bessonov ............... H01L 27/24 |

* cited by examiner

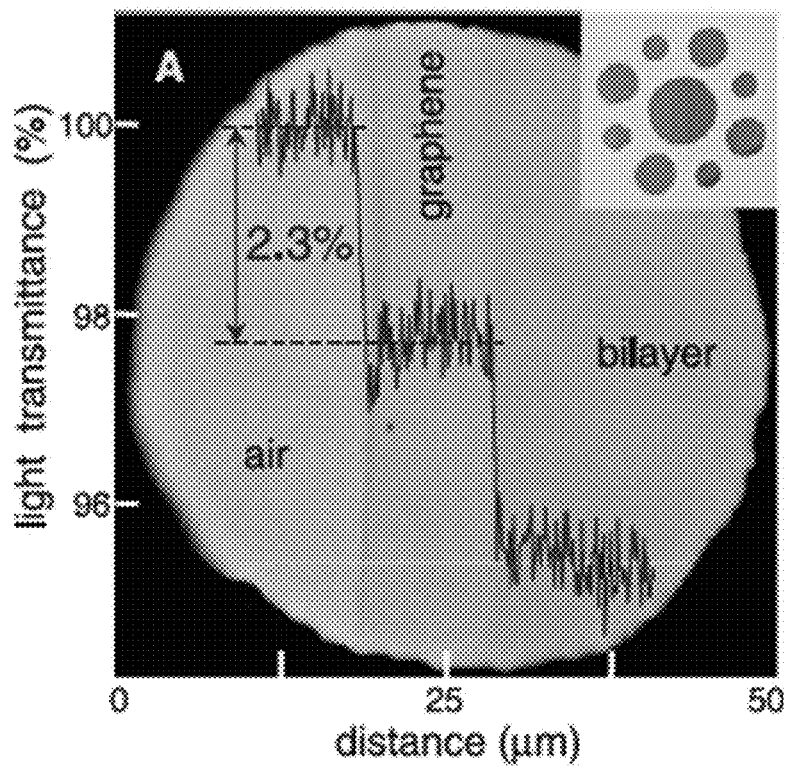
FIG. 10 – PRIOR ART
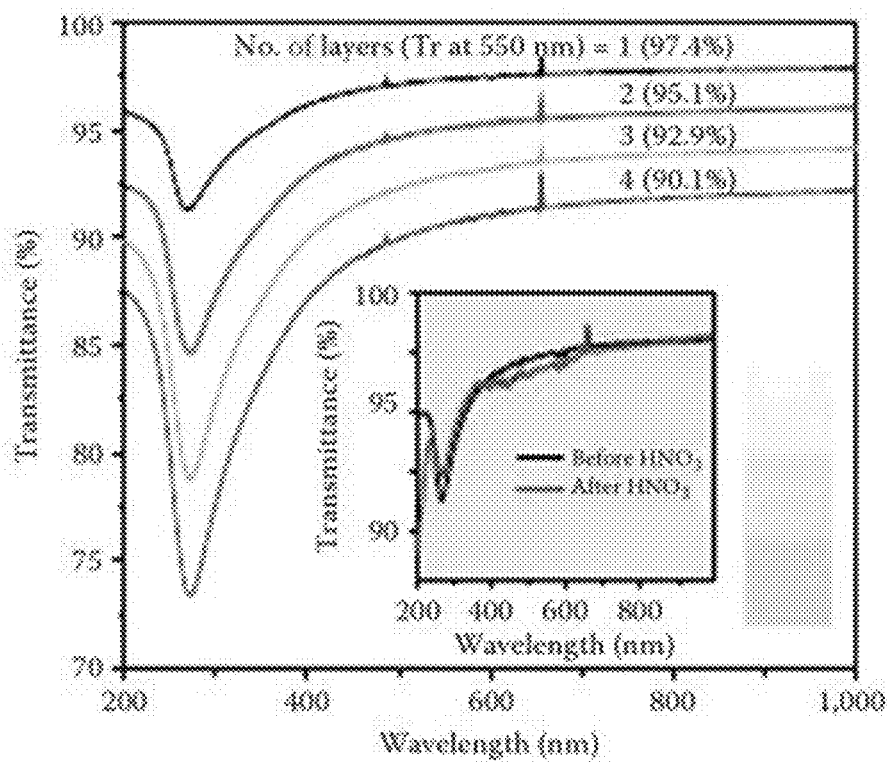
FIG. 11 – PRIOR ART

PHOTO SENSOR FOR USE AS A RADIATION DETECTOR AND POWER SUPPLY AND METHOD FOR MAKING AND USING THE DEVICE

CROSS REFERENCE TO RELATED APPLICATION

This application claims the benefit of the earlier filing date of U.S. Provisional Application No. 62/013,841, filed on Jun. 18, 2014, the disclosure of which is hereby incorporated herein by reference.

FIELD

The apparatus and method disclosed herein relate to energy conversion, and further relate to detectors, electronic devices, and/or energy storage devices.

BACKGROUND

Radiation detection instrumentation can be broadly classified as gas-filled detectors, scintillators, and semi-conductors. Scintillators, in particular, are important because they are easy to use, and can provide information on a particle's energy. The main components of current scintillator-based detectors are the scintillation crystal itself and a photomultiplier tube (PMT), which includes photocathodes and dynodes. The photocathodes absorb low energy (near visible) photons created from interactions of the incident radiation with the crystal, and in-turn generate electrons (i.e., photoelectrons). Because the number of photoelectrons produced is proportional to the incident particle energy, these detectors can be used to detect and identify a radionuclide. Photocathodes typically have a maximum quantum efficiency of approximately 25%. Quantum efficiency is defined as the number of photoelectrons produced from the number of incident photons.

Quantum Efficiency=(# of electrons generated)/(# of incident photons)

The other component of the PMT is the electron multiplication structure, which consists of dynodes that amplify the number of photoelectrons generated from the photocathode because their signal is so low. Photomultiplier tubes typically have about $10^6$-$10^7$ gain at the anode for collection. They usually require anywhere from a few hundred volts up to thousands of volts. This configuration creates inherent disadvantages, include a high bias voltage, dynode fragility, and magnetic field effects (i.e., electron trajectories between dynodes are altered by EM fields). Accordingly, there is a need for new radiation detection technology.

New energy production and storage technologies also are important considerations. Energy transitions fluidly between mechanical, chemical, electrical, magnetic, radiant, and nuclear forms. Current devices and technological limitations prevent or impede exploitation of this feature, and energy that could be used for productive work is lost or inefficiently used. As demand for energy increases, the need for inexpensive and efficient ways to use energy becomes increasingly important.

SUMMARY

Disclosed embodiments of the apparatus are useful for variety of beneficial purposes, depending on the particular configuration. For example, some embodiments of the apparatus can be used to detect a byproduct of a nuclear reaction. Other embodiments function as a power supply to generate current for electrical circuits or to charge batteries.

Certain disclosed embodiments of the apparatus comprise an electrically insulating, optically reflective material, an electrode, and a photodetecting material positioned on a substrate, including scintillating and semiconductor substrates, and adjacent to the electrodes. In such embodiments, the optically reflective material surrounds at least a portion of the electrode, the photodetecting material, the substrates, or combinations thereof. This feature enhances optical absorption and thereby facilitates apparatus efficiency. The optically reflective material comprises an inner surface and an outer surface. The inner surface is optically reflective to reflect electromagnetic radiation towards the photodetecting material. The outer surface may be optically opaque. In some similar embodiments, the apparatus comprises at least two different optically reflective materials to reflect electromagnetic radiation towards the photodetecting material.

In some embodiments the apparatus includes interdigitated electrodes. In particular embodiments the interdigitated electrodes comprise two different materials, such as two different metals, having different Seebeck coefficients. Interdigitating the electrodes facilitates charge collection while still preventing charge from leaking directly from one electrode to another electrode.

Certain disclosed embodiments function as a radiation detector and replace the photomultiplier tube of a scintillation-based detector with a thin film (for example and not limited to, monolayer (2-dimentional (2D)) and multi-layer (3D)) materials. Photons emanating from a scintillation material are absorbed by a material, typically a thin film material, and an electrical signal is produced. This electrical signal is a direct indication of radiation. Examples of monolayer materials that have significant quantum efficiencies include graphene, $MoS_2$, or GaAs. Using monolayer materials provides superior light collection, while potentially avoiding the need for amplification or external gain, creating radiation detecting devices that are more robust, smaller, and potentially less expensive to manufacture.

An apparatus may further comprise a signal detector to detect one or more electrical signals transmitted by the electrodes. Signal values corresponding to the electrical signals can be displayed on a user interface. Additionally, the user interface can accept input from a user specifying one or more signal detector operations. For applications where a user would like to identify a particular nuclear reaction byproduct, for example, the user interface can display energy levels detected by the apparatus, and/or display the identity of a particular byproduct.

Certain disclosed configurations can further facilitate operation efficiency. For example, the photodetecting material can be positioned on the substrate to form a repeating pattern of alternating first and second regions. The first region comprises the photodetecting material deposited on the substrate, and the second region comprises the substrate. Electrodes, including interdigitated electrodes, are positioned perpendicular to the photodetecting material repeating pattern such that the interdigitated electrodes and the photodetecting materials form a grid pattern on the substrate. This configuration facilitates energy transfer between the photodetecting materials and the electrodes, as well as absorption by the photodetecting materials of, for example, light emitted by the substrate. This embodiment can also increase the structural integrity of the apparatus.

Another benefit of certain embodiments is compact design. For example, in some configurations the photodetecting material comprises a photodetecting layer having a single-atom and/or single-molecule thickness. In the same and/or other configurations, at least one photodetecting layer has multiple-atoms and/or multiple-molecules thickness. In some embodiments, the layers comprise at least a photosensitive layer and an electrically conductive layer. The photosensitive layer is positioned adjacent to the substrate, and the electrically conductive layer is positioned adjacent to the electrodes. In this configuration, the respective features of the two layers combine to facilitate photosensitivity and conductivity.

Some embodiments operate as a power supply and utilize energy emitted by nuclear reactions, and therefore include a radiation source. Optically reflective material surrounds at least a portion of the electrode, the photodetecting material, the substrate, the radiation source, and combinations thereof. These embodiments can be used to provide long-lasting, steady current to electrical devices.

The substrate also may comprise a flexible material, such as a polymeric material. This allows the apparatus to contour to surfaces having various shapes. Flexible materials also can be used to dynamically flex with shapes, such as body parts of mammals, including humans, or any other body/medium that radiates heat.

In some embodiments, the optically reflective material, the electrode, the photodetecting material, the substrates, or combinations thereof may have complementary surfaces, such as a complementary shape and/or complementary molecular structures. These features also enhance the structural integrity and durability of the apparatus.

Embodiments of a method for making the apparatus also are disclosed. For example, the method may comprise providing one or more photodetecting materials positioned on one or more substrates, placing one or more electrodes adjacent to the photodetecting materials and placing one or more optically reflective materials adjacent to the electrodes and/or substrate. The method may comprise additional and/or optional steps, including: placing a radiation source adjacent to the substrates and/or at least one of the optically reflective materials; placing a radiation mediator sufficiently adjacent to a scintillator to transmit a first and/or second radiation type to a scintillator; connecting a signal detector to the electrodes; interdigitating the electrodes; spacing the electrodes at a devised spacing, such as a spacing useful to prevent or substantially minimize conduction of electrical energy between the interdigitated electrodes; and patterning the photodetecting material on the substrates to form a repeating pattern of alternating first and second regions.

Embodiments of a method for using the device are disclosed. The method may include positioning the apparatus sufficiently adjacent to a radiation source to detect radiation emitted by the radiation source; reading one or more electrical signal values from a signal detector user interface; entering instructions into a signal detector using a user interface; connecting the apparatus to a circuit comprising one or more batteries and/or one or more electronic devices; and placing the apparatus adjacent to an infrared electromagnetic radiation source.

BRIEF DESCRIPTION OF THE FIGURES

FIG. 10 is a graph of transmittance as a function of graphene thickness (distance) illustrating 2.3% and 4.6% light absorption in single layer graphene and bi-layer graphene, respectively.

FIG. 11 is graph of optical absorption as a function of graphene layers over a wide spectrum of wavelengths.

DETAILED DESCRIPTION

Figure 1:
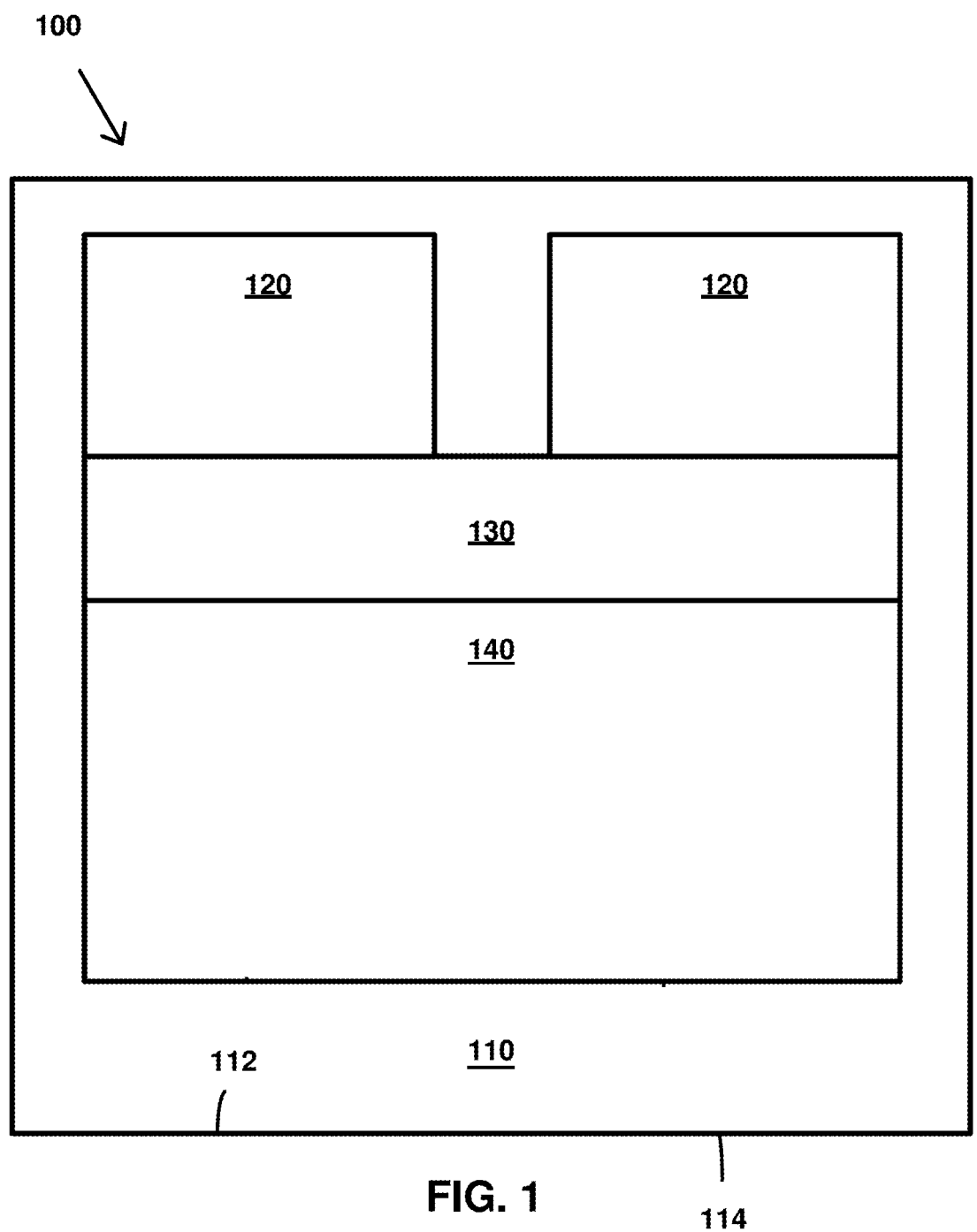
FIG. 1 is a schematic edge view illustrating a first embodiment of an apparatus in accordance with the present invention.

Various embodiments of the present apparatus are described below in terms of features, structure, and components, individually and collectively. A person of ordinary skill in the art will recognize that the uses and particular embodiments described herein are exemplary and are not intended to limit the scope of the apparatus or the method for making or using the apparatus.

Disclosed embodiments of the apparatus can be used in applications that benefit from converting one energy type to another energy type. For example, in some embodiments, the apparatus converts energy between one or more types of nuclear energy, electromagnetic energy, electrical potential energy, and/or thermal energy. In some embodiments, the apparatus is useful for energy detection. For example, the apparatus may detect energy emitted by materials undergoing nuclear reactions. These nuclear reactions can comprise nuclear decay, nuclear fission, nuclear fusion, or combinations thereof.

The apparatus also may provide electrical energy to one or more circuits, one or more batteries, or combinations thereof. For example, in some embodiments the apparatus converts energy emitted as a result of a nuclear reaction to electrical and/or thermal energy. In other embodiments, the apparatus converts electromagnetic energy into electrical potential and/or thermal energy.

I. Definitions

Coupled: The term "coupled" means joined together, either directly or indirectly.

Detect: To determine if an agent (such as a signal) is present or absent. In some examples, this can further include quantification and/or localization. "Detecting" refers to any method of determining if something exists, or does not exist. For example, "detecting" can include using a visual or a mechanical device to determine if a sample displays a specific characteristic.

Electromagnetic radiation: Electromagnetic waves that are propagated by simultaneous periodic variations of electric and magnetic field intensity, and that includes radio waves, infrared, visible light, ultraviolet light, X-rays and gamma rays.

Enhanced Specularly Reflective Film: A film that specularly reflects substantially all incident light, such as at least 98% of incident light. Specular reflection is mirror-like reflection of light (or of other kinds of wave) from a surface. For example, light from a single incoming direction may be reflected into a single outgoing direction.

Extreme ultraviolet: Electromagnetic radiation having a wavelength ranging from about 10 nm to about 120 nm.

Isotropically reflective: A material reflects without directional preference. Materials whose refractive index do not depend on the direction that the light travels are called isotropic materials. Isotropic materials have a single, constant refractive index for each wavelength. For example, a material is isotropically reflective if it reflects incident light at an angle different than the light's angle of incidence.

Radiation: Energy radiated by a source, including electromagnetic radiation and the byproducts of nuclear reactions.

Reflect/Reflective: Certain disclosed embodiments of the present invention are intended to reflect impinging energy, such as electromagnetic radiation at certain wavelengths, while being transparent to electromagnetic radiation of a different wavelength. A person of ordinary skill in the art will appreciate that what is reflected or transmitted is determined by considering the context of a particular application or apparatus configuration. For example, certain disclosed embodiments concern radiation detectors where an external radiation source emits energy in the range of from 10 s of eV to MeV range in energy. Such energy is transmitted into the device to impinge a scintillating material, which then emits energy having a wavelength of from about 200 nm to about 1200 nm, typically from about 200 nm to about 1000 nm, more typically from about 400 nm to about 700 nm, and even more typically from about 350 nm to about 550 nm. Thus, certain disclosed embodiments of the device are internally reflective for energy of from about 200 nm to about 1200 nm to facilitate opportunities to convert electromagnetic radiation that originally passed through photodetecting materials without being converted.

Ultraviolet: Electromagnetic radiation having a wavelength ranging from about 10 nm to about 400 nm.

II. Photodetecting Materials

Disclosed embodiments of the present invention generally include a layer, typically a thin layer, comprising a photon detecting material, referred to herein as photodetecting materials. Materials useful for making photodetecting layers are discussed below.

A. Graphene

Graphene has a number of beneficial material properties useful for implementing disclosed embodiments of the present invention, including: excellent electrical conductivity (electron mobility hundreds of times greater than silicon); high material strength; high thermal conductivity; and extremely low permeability even to helium atoms. Recent focus has concentrated on devices that utilize the speed at which electrons travel in graphene.

Graphene's greatest promise, however, may involve photovoltaic and photo-thermoelectric properties that can be used for novel devices for photon sensing and energy-harvesting applications. Graphene is able to detect photons by the photovoltaic effect, the photo-thermoelectric effect, the bolometric effect, or a photogating effect, when combined with another material.

FIG. 10 illustrates that a single layer of graphene has a consistent 2.3% optical absorption of light in the visible range. To increase the absolute absorption of light, Alwarappan and Kumar (2013) showed that stacking four layers of graphene resulted in a 15% optical absorption of the light in the 400 nm range. It is also possible to significantly increase this light absorption through doping or electrically back-gating (aka field effect). For each photon absorbed, approximately nine electrons may be available for charge collection. This represents a substantial increase over that which is produced from traditional photocathodes.

Graphene also can absorb light over a wide spectrum range. This includes ultraviolet, visible, short-wave infrared (SWIR), near-infrared (NIR), mid-infrared (MIR), far-infrared (FIR) and terahertz (THz) spectral regimes.

The liberation of photoelectrons can be described in terms of a photovoltaic effect. A photon is absorbed into the graphene, and an excited electron is ejected, and is available for charge collection. This photovoltaic electron can be collected with an applied external voltage bias.

Additionally, through a photo-thermoelectric-effect (PTE) process, lower energy transfers occur with neighboring electrons creating so-called "hot-carriers". These hot carriers cannot be collected with an applied bias, but instead are collected by a thermoelectric process that occurs between the heat differential of an electrode/graphene junction and the end of the wire where the electrical signal is measured. Called the Seebeck effect, this phenomenon describes a voltage potential that is created when two different metals in contact with each other are introduced to a heat source. A Seebeck coefficient value (normally measured in units of uV/Celsius) is an inherent value of each individual metal when exposed to heat. This is the same mechanism used to create thermocouples. Electrode configuration, such as interdigitated electrodes, can be used to collect the hot-carriers. Using two different metals with different Seebeck coefficients provides an asymmetric built-in electric so that the total photocurrent is not zero.

Accordingly, disclosed embodiments may include one layer, or multiple layers, of graphene for detecting photons. Graphene can be used alone, or in combination with other photodetecting materials, such as those disclosed below. Certain disclosed embodiments use heterostructures, which are a combination of two or more photodetecting materials that produce an additive or synergistic effect. For example, two or more materials may be used in combination to collect electrons liberated by scintillation photons more efficiently than each material acting alone.

B. Transition Metal Oxides/Chalcogenides/Arsenides

Other materials suitable as photodetecting materials exist that can be used in disclosed embodiments of the present invention. These materials also can be used generally as thin films, similar to graphene, and can be used alone or in combination with graphene. These materials include transition metal oxides (TMO), transition metal dichalcogenides (TMD), and transition metal arsenides.

A transition metal is any metallic element from Groups 3 through 12 in the Periodic Table. The transition metals include scandium, titanium, vanadium, chromium, manganese, iron, cobalt, nickel, copper, zinc, yttrium, zirconium, niobium, molybdenum, technetium, rubidium rhodium, lead, silver cadmium, lanthanum, hafnium, tellurium, tungsten, rhenium, osmium, iridium, platinum, gold, mercury, and actinium.

Metal oxides, chalcogenides and arsenides of the transition metals generally have an incomplete inner electron shell that. A transition metal chalcogenide is compound comprising at least one chalcogen anion and at least one electropositive transition metal. Chalcogenide typically refer to sulfides, selenides, and tellurides. In thin layers, oxides, chalcogenides and arsenides of the transition metals exhibit optical properties similar or complementary to graphene.

Molybdenum disulfide ($MoS_2$) is a particular example of a suitable transition metal chalcogenide for practicing disclosed embodiments of the present invention. The optical absorption of $MoS_2$ is about 22% in the visible light range. A particular example of a suitable arsenide is gallium arsenide (GaAs).

A person of ordinary skill in the art will appreciate that photodetecting materials also may be used in combination

III. Scintillating Materials

Certain disclosed embodiments concern scintillators useful for detecting radiation emitted by radioactive materials, or that include a radioactive material and are useful as a power supply. Accordingly, these embodiments include a scintillating material.

A scintillator is any material that exhibits scintillation, which is luminescence when excited by ionizing radiation. Luminescent materials absorb energy of impinging particles or photons and scintillate, re-emitting the absorbed energy as light. Any scintillating material now known or hereafter developed or discovered can be used to practice disclosed embodiments of the present invention.

In some embodiments, the scintillating material is selected to correspond to a type and/or level of energy to be converted to electromagnetic radiation. For example, in one embodiment, the scintillating material emits electromagnetic radiation in response to receiving α-particles, β-particles, neutrons, γ-rays, x-rays, extreme ultraviolet electromagnetic radiation, ultraviolet electromagnetic radiation, or combinations thereof. In some embodiments, the scintillating material is selected to correspond to a level of luminosity. In such embodiments, the scintillating material has a luminosity of from greater than 0 to 125,000 photons per Mega electron Volt. In additional embodiments, the scintillating material is selected to correspond to a peak photon wavelength. In such embodiments, the desired peak photon wavelength typically ranges from about 100 nanometers to about 700 nanometers, from about 150 nanometers to about 600 nanometers, from about 200 nanometers to about 550 nanometers, from about 300 nanometers to about 500 nanometers, or from about 350 nanometers to about 450 nanometers.

Exemplary classes of scintillating materials useful for practicing disclosed embodiments of the present invention are discussed below.

Inorganic scintillators are usually crystals grown in high temperature furnaces. Alkali metal halides and doped alkali metal halides are one example of a genus of materials useful as inorganic scintillating materials. One common example is NaI(Tl) (sodium iodide doped with thallium). Other exemplary inorganic alkali halide crystals include: CsI(Tl), CsI(Na), CsI(pure), CsF, KI(Tl), LiI(Eu). Some non-alkali crystals include: $BaF_2$, $CaF_2(Eu)$, ZnS(Ag), $CaWO_4$, $CdWO_4$, YAG(Ce) ($Y_3Al_5O_{12}(Ce)$), GSO, LSO. Newly developed products include $LaCl_3(Ce)$, lanthanum chloride doped with Cerium, as well as a Cerium-doped lanthanum bromide, $LaBr_3(Ce)$. Both provide excellent light output and energy resolution (63 photons/keV γ for $LaBr_3(Ce)$ versus 38 photons/keV γ for NaI(Tl)), a fast response (16 ns for $LaBr3(Ce)$ versus 230 ns for NaI(Tl)), excellent linearity, and a very stable light output over a wide range of temperatures. In addition $LaBr_3(Ce)$ offers a higher stopping power for γ rays (density of 5.08 g/cm$^3$ versus 3.67 g/cm$^3$ for NaI(Tl). LYSO ($Lu_{1.8}Y_{0.2}SiO_5(Ce)$) has an even higher density (7.1 g/cm$^3$, comparable to BGO), is non-hygroscopic, and has a higher light output than BGO (32 photons/keV γ), in addition to being rather fast (41 ns decay time versus 300 ns for BGO).

The most common glass scintillators are cerium-activated lithium or boron silicates. Since both lithium and boron have large neutron cross-sections, glass detectors are particularly well suited to detecting thermal (slow) neutrons. Lithium is more widely used than boron since it has a greater energy release on capturing a neutron and therefore greater light output. Glass scintillators are, however, sensitive to electrons and γ rays as well (pulse height discrimination can be used for particle identification). Being very robust, they are also well-suited to harsh environmental conditions. Their response time is ≈10 ns, their light output is however low, typically ≈30% of that of anthracene.

Organic scintillators typically are aromatic hydrocarbon compounds that contain benzene ring structures. Their luminescence typically decays within a few nanoseconds. Some organic scintillators are pure crystals. The most common types are anthracene ($C_{14}H_{10}$, decay time ≈30 ns), stilbene ($C_{14}H_{12}$, 4.5 ns decay time), and naphthalene ($C_{10}H_8$, few ns decay time). They are very durable, but their response is anisotropic, which spoils energy resolution when the source is not collimated. Anthracene has the highest light output of all organic materials. Organic scintillators also cannot be easily machined, nor can they be grown in large sizes.

Plastic scintillators typically are scintillating materials suspended in a solid polymer matrix. This combination is typically made by dissolving a fluor in polymer forming reagents prior to bulk polymerization. The fluor is sometimes associated with the polymer directly, either covalently or through coordination, as is the case with many Li6 plastic scintillators. Polyethylene naphthalate has been found to exhibit scintillation by itself without any additives. The advantages of plastic scintillators include fairly high light output and a relatively quick signal, with a decay time of 2-4 nanoseconds. Perhaps the biggest advantage of plastic scintillators is their ability to be shaped into almost any desired form.

Aromatic polymers also can be useful scintillating materials. Typically these polymers include pendent aromatic rings along a polymer backbone. Examples include polyvinyltoluene (PVT) and polystyrene (PS). While the polymer does fluoresce in the presence of ionizing radiation, it often exhibits low yield and negligible transparency to its own emission making the use of fluors in combination suitable for making a scintillator.

Exemplary fluors include polyphenyl hydrocarbons, oxazole and oxadiazole aryls, especially, n-terphenyl (PPP), 2,5-diphenyloxazole (PPO), 1,4-di-(5-phenyl-2-oxazolyl)-benzene (POPOP), 2-phenyl-5-(4-biphenylyl)-1,3,4-oxadiazole (PBD), and 2-(4'-tert-butylphenyl)-5-(4"-biphenylyl)-1,3,4-oxadiazole (B-PBD). Aside from the aromatic plastics, another common polymeric material used to make scintillating materials is polymethylmethacrylate (PMMA). PMMA has high ultraviolet and visible light transparency, and has suitable mechanical properties. The lack of fluorescence associated with PMMA is often compensated by adding an aromatic co-solvent, such as naphthalene. Other common polymeric materials include polyvinyl xylene (PVX) polymethyl, 2,4-dimethyl, 2,4,5-trimethyl styrenes, polyvinyl diphenyl, polyvinyl naphthalene, polyvinyl tetrahydronaphthalene, and copolymers thereof.

IV. Apparatus Embodiments

FIG. 1 depicts an apparatus 100 comprising one or more optically reflective materials 110. Optically reflective material 110 may be electrically insulating. Apparatus 100 also includes electrodes 120, including transparent electrodes in certain embodiments, positioned adjacent to the optically reflective material 110. Additionally, apparatus 100 includes a photodetecting material 130 positioned on a substrate 140 and adjacent to the electrodes 120.

Optically reflective material 110 comprises an inner surface 112 and an outer surface 114. The inner surface 112 is optically reflective to reflect electromagnetic radiation towards the photodetecting material 130. The outer surface 114 is optically opaque and/or optically reflective to reflect electromagnetic radiation away from the apparatus 100.

The inner surface 112 and/or outer surface 114 are electrically conductive and/or electrically insulative. For example, in one embodiment, the inner and outer surfaces 112, 114 are both electrically insulative. In another embodiment, the inner surface 112 is electrically insulative and the outer surface 114 is electrically conductive. In yet another embodiment, the inner and outer surfaces 112, 114 are both electrically conductive.

The inner and/or outer surface 112, 114 may comprise the same or different material. Such embodiments may be selected to take advantage of reflective and/or electrical properties not available in one single material. For example, in some embodiments it may be desirable to contain electromagnetic radiation inside the apparatus 100 while precluding electromagnetic radiation from outside the apparatus from entering.

In one example, the inner surface 112 comprises one or more materials that reflect electromagnetic radiation to the photodetecting material 130. The outer surface 114 also may comprise one or more materials opaque to electromagnetic radiation. In other embodiments, the outer surface 114 comprises one or more materials opaque to substantially all electromagnetic radiation wavelengths. In yet other such embodiments, the outer surface 114 comprises one or more materials opaque to electromagnetic radiation wavelengths from 100 nanometers to 700 nanometers, from 150 nanometers to 600 nanometers, from 200 nanometers to 550 nanometers, from 300 nanometers to 500 nanometers, and/or from 350 nanometers to 450 nanometers. It is not necessary, however, that the outer surface 114 be opaque to electromagnetic radiation. In some embodiments it is beneficial for the inner surface 112, the outer surface 114, or both, to be transparent to electromagnetic radiation. For example, in one embodiment, the inner and outer surfaces 112, 114 are transparent to electromagnetic radiation to which the photodetecting material 130 is sensitive.

Some disclosed embodiments include specularly reflective materials 110. Exemplary embodiments include those where the optically reflective material 110 comprises one or more metal oxides, such as aluminum oxide and/or magnesium oxide. The apparatus 100 also may include isotropically reflective materials 110, such as halogenated polyalkylenes, with halogenated polyethylenes being a particular example. Minerals that crystallize in the isometric system, by virtue of their symmetry, are isotropic. Similarly, glass, gases, most liquids and amorphous solids are isotropic. In one particular embodiment, the one or more optically reflective materials comprise polytetrafluoroethylene.

In some embodiments, apparatus 100 can include optically reflective materials 110 to shield the electrodes 120, the photodetecting material 130, the substrates 140, or combinations thereof, from radiation, or to prevent radiation from escaping the apparatus 100. In such embodiments, the optically reflective materials 110 absorb and/or reflect radiation. For example, in one embodiment, the optically reflective materials 110 absorb $\alpha$ particles, neutrons, $\beta$ particles, gamma rays, x-rays, or combinations thereof.

Figure 2:
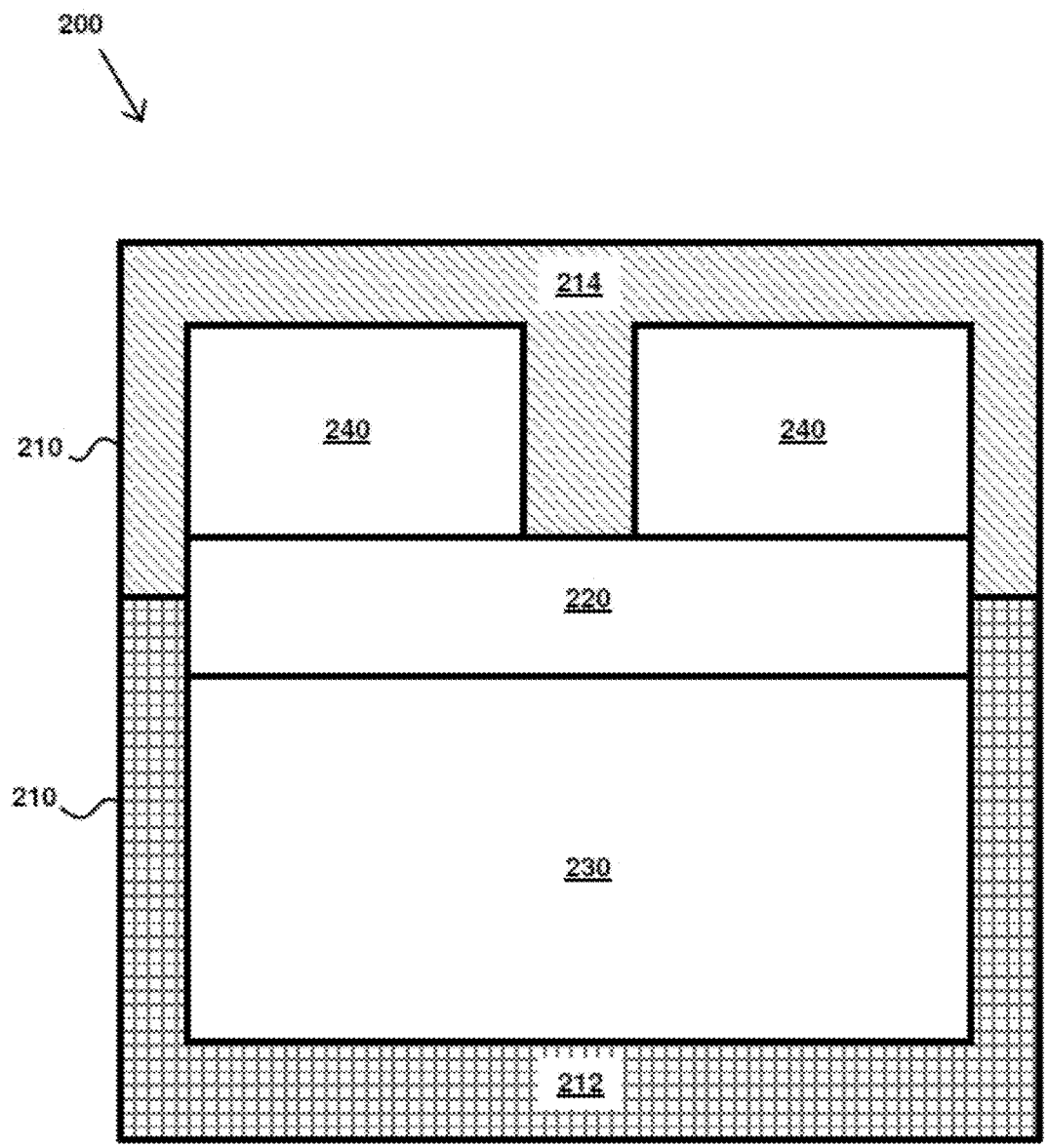
FIG. 2 is a schematic edge view illustrating an embodiment of an apparatus comprising at least one optically reflective material and at least one electrically insulative optically reflective material.

FIG. 2 illustrates an apparatus embodiment 200 comprising at least two optically reflective materials 210 to reflect electromagnetic radiation towards the photodetecting material 220. At least one optically reflective material 210, and an electrically uninsulated but optically reflective material 212, is positioned adjacent to one or more substrates 230 to reflect electromagnetic radiation towards the photodetecting material 220. At least one other optically reflective material 210, an electrically insulative optically reflective material 214, is positioned adjacent to one or more electrodes 240 to reflect electromagnetic radiation towards the photodetecting material 220. In certain embodiments, it is beneficial to configure the apparatus 200 such that the optically reflective materials 210 are positioned to reflect electromagnetic radiation towards the photodetecting material 220. Furthermore, in at least some embodiments, the optically reflective materials surround at least a portion of the electrodes 240, the photodetecting material 220, the substrates 230, or combinations thereof.

Figure 3:
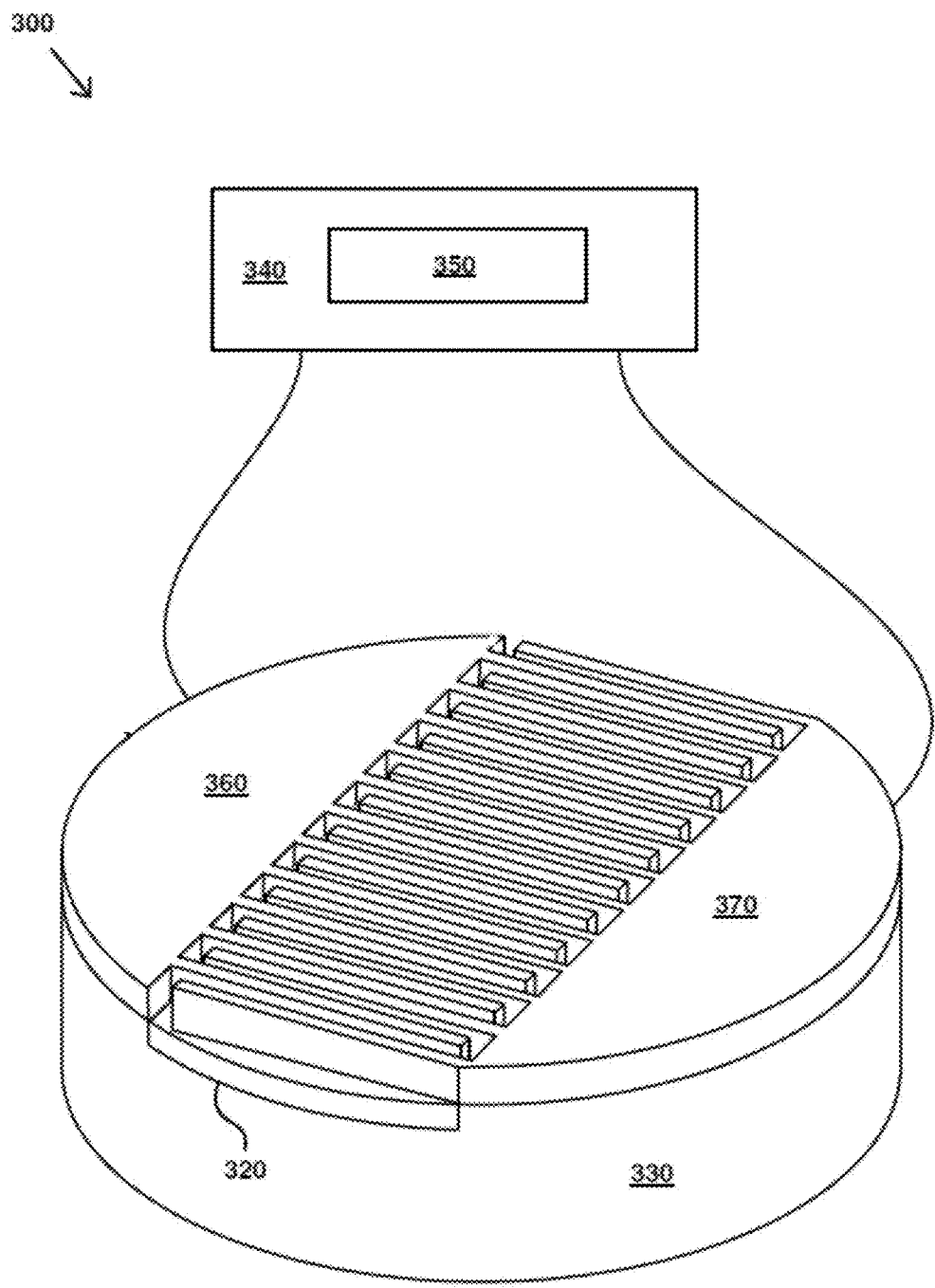
FIG. 3 is a schematic plan view of an embodiment of an apparatus comprising a signal detector, a user interface, and two electrodes.

FIG. 3 depicts an apparatus embodiment 300 comprising electrodes 360 and 370 deposited on photodetecting materials 320. Photodetecting material 320 is deposited on one or more substrates 330, such as a scintillating material. Substrate 330 converts energy emitted during nuclear reactions into electromagnetic radiation, and then emits the electromagnetic radiation. The electromagnetic energy impinges photosensitive material 320, which converts the electromagnetic radiation emitted by the substrate 330 into electrical and/or thermal energy and transfers the electrical and/or thermal energy to electrodes 360 and 370. Finally, the electrodes 360 and 370 transmit, to one or more signal detectors 340, the energy transferred by the photosensitive material 320.

Electrodes 360 and 370 may be at least partially optically transparent, at least partially optically reflective, or both, to provide the photodetecting material 320 additional opportunities to convert electromagnetic radiation that originally passed through the photodetecting materials without being converted. For example, the electrodes 360 and 370 may comprise spectrally reflective or isotropically reflective materials and be positioned to reflect electromagnetic radiation towards the photodetecting material 320.

Apparatus 300 comprises at least two interdigitated electrodes 360 and 370 sufficiently spaced apart to prevent conduction of electrical energy between the interdigitated electrodes. This feature is particularly useful in facilitating transfers of electrical and/or thermal energy transferred by the photodetecting material 320 to the electrodes 360 and 370.

The electrodes 360 and 370 typically comprise an electrically conductive metal, such as gold, silver, platinum, titanium, palladium or combinations thereof. Alternatively, one or more of the electrodes 360 and 370 may comprise a semiconductor material. For example, one or more of the electrodes may comprise graphene.

The one or more electrodes comprise at least a first electrode 360 having a first Seebeck coefficient and a second electrode 370 having a second Seebeck coefficient. The first Seebeck coefficient is different than the second Seebeck coefficient. For example, the difference between the first Seebeck coefficient and the second Seebeck coefficient is between greater than 0 to about 1100 Micro Volts per Kelvin, from about 100 to about 1000 Micro Volts per Kelvin, between about 200 to about 900 Micro Volts per Kelvin, between about 300 to about 800 Micro Volts per Kelvin, between about 400 to about 700 Micro Volts per Kelvin, or between about 500 to about 600 Micro Volts per Kelvin.

Apparatus 300 further comprises a signal detector 340 to detect the electrical signals. The signal detector 340 comprises a user interface 350 to display one or more electrical signal values corresponding to the electrical signals. Additionally or alternatively, the user interface 350 accepts input from a user specifying one or more signal detector operations.

One embodiment according to FIG. 3 functions as a radiation detector. A particular embodiment includes a graphene layer 320 deposited on a scintillation material 330, such as a CsI(Ti) crystal. Two different electrode materials are used to form interdigitated electrodes. In a particular embodiment the two different metals are titanium (source) and palladium (drain).

Figure 4:
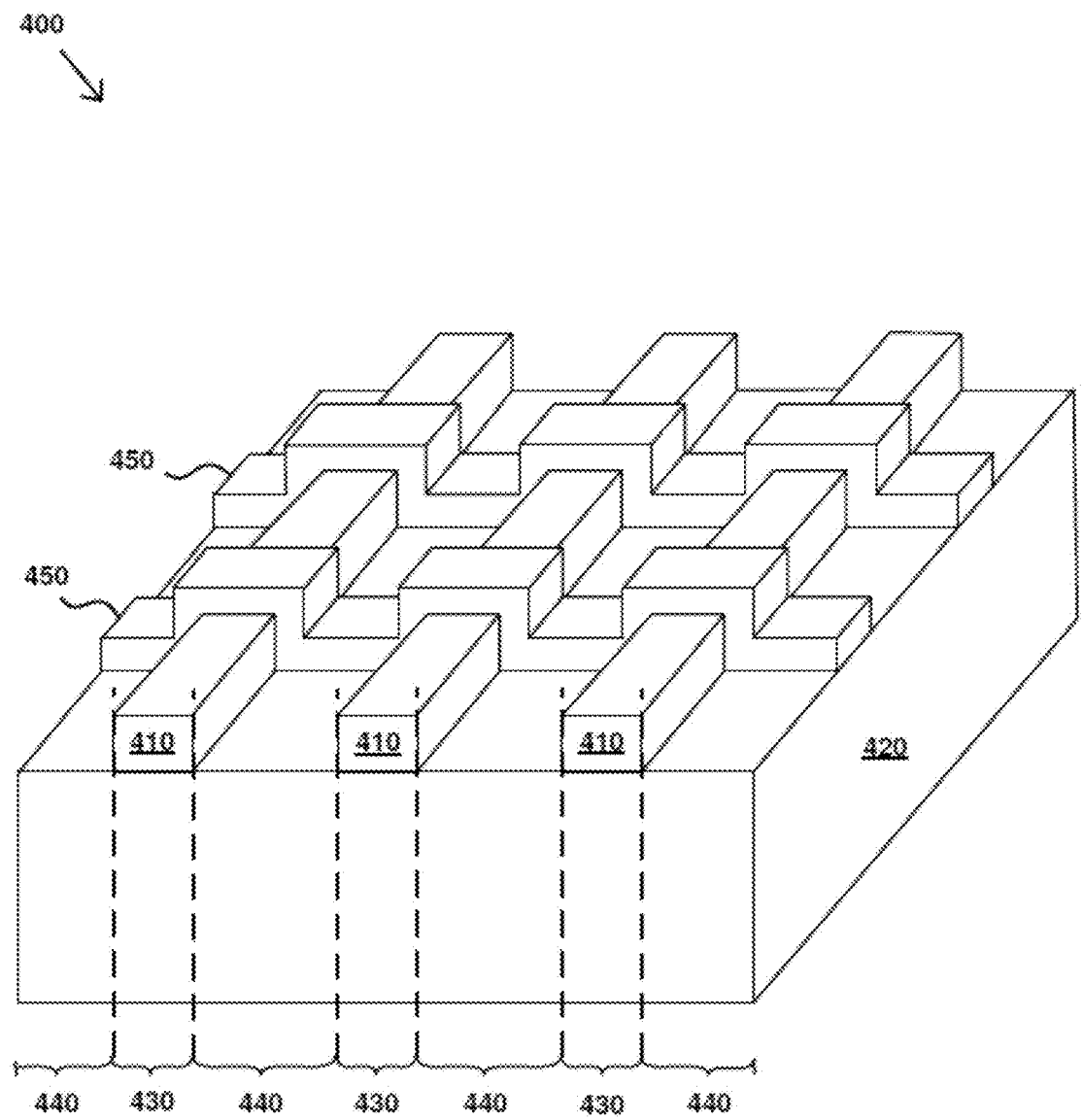
FIG. 4 is a schematic perspective view of an embodiment of an apparatus comprising photodetecting materials positioned to form a repeating pattern of alternating first and second regions with electrodes.

FIG. 4 depicts an embodiment 400 comprising one or more photodetecting materials 410 that transmit electrical energy, thermal energy, or both, in response to receiving electromagnetic radiation. The photodetecting materials 410 are positioned on one or more substrates 420, such as a scintillating substrate, to form a repeating pattern of alternating first and second regions 430, 440. The first region comprises the photodetecting material 410 deposited on the substrate 420. The second region 440 comprises the substrate 420. The apparatus 400 further comprises one or more electrodes 450, such as interdigitated electrodes. Electrodes 450 are positioned perpendicular to the photodetecting materials 410 such that the electrodes 450 and the photodetecting materials 410 form a grid pattern on the substrates 420.

The patterned configuration depicted in FIG. 4 can be particularly useful to facilitate securing the electrodes 450 to the apparatus 400. The illustrated configuration provides an area in region 440 for the electrodes 450 to be deposited directly on the substrates 420. In some embodiments, the electrodes 450 may not bind sufficiently to the photodetecting materials 410 to ensure they are secured to the apparatus 400. Thus, in these embodiments, the electrodes are in electrical contact, thermal contact, or both, with the photodetecting materials 410 and are deposited on the substrate 420.

Figure 5:
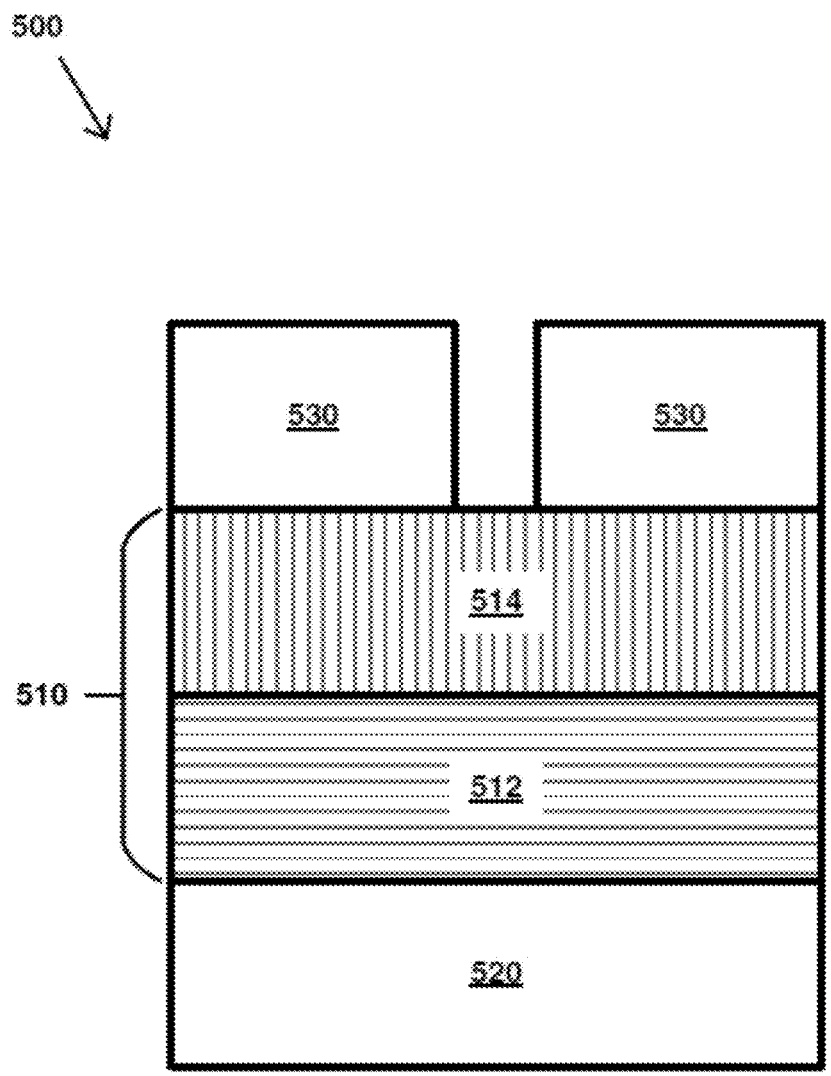
FIG. 5 is a schematic illustration of an embodiment comprising one or more layers of photodetecting materials.

FIG. 5 depicts an embodiment 500 comprising one or more photodetecting material layers 510. In some embodiments, the layers comprise at least a photosensitive layer 512 and an electrically conductive layer 514. The photosensitive layer 512 is positioned adjacent to one or more substrates 520, and the electrically conductive layer 514 is positioned adjacent to one or more electrodes 530. Potentially, there could be an optically transparent layer between 512 and 520 to facilitate adherence of the materials to each other. Having at least two photodetecting layers designed particularly for conductivity and/or photosensitivity can increase the overall effectiveness of the photodetecting materials 510 relative to using an individual photodetecting layer 510.

Photosensitive material 510 converts electromagnetic radiation into electrical and/or thermal energy and transfers the electrical and/or thermal energy. The electromagnetic radiation may, in some embodiments, have been emitted by a substrate 520. In other embodiments, the electromagnetic radiation can be from other sources, including sources external to the apparatus 500. The electrodes 530 transmit the energy transferred by the photosensitive material 510.

In some embodiments, at least one photodetecting layer has a single-atom and/or single-molecule thickness. In additional embodiments, at least one photodetecting layer has multiple-atoms and/or multiple-molecules thickness. Other embodiments comprise at least one photodetecting layer having a thickness of from about 0.3 nanometers to about 10 micrometers thick, such as from about 1 nanometer to about 6 micrometers thick, or from about 1 micrometer to about 3 micrometers thick. For certain particular embodiments at least one photodetecting layer was about four micrometers thick.

These thickness values provide various benefits. For example, in some embodiments, the photodetecting layers 510 are selected for compact apparatus design. In the same and/or other embodiments, the photodetecting layer thicknesses of 510 are selected to facilitate absorption of electromagnetic radiation. In such embodiments, the photodetecting materials 510 absorb from greater than 0 to substantially 100% of incident electromagnetic radiation, such as from about 5% to 95%, from about 15% to about 85%, from about 20% to about 80%, from about 30% to about 70%, from about 40% to about 60%, or from about 45% to about 55%.

Figure 6:
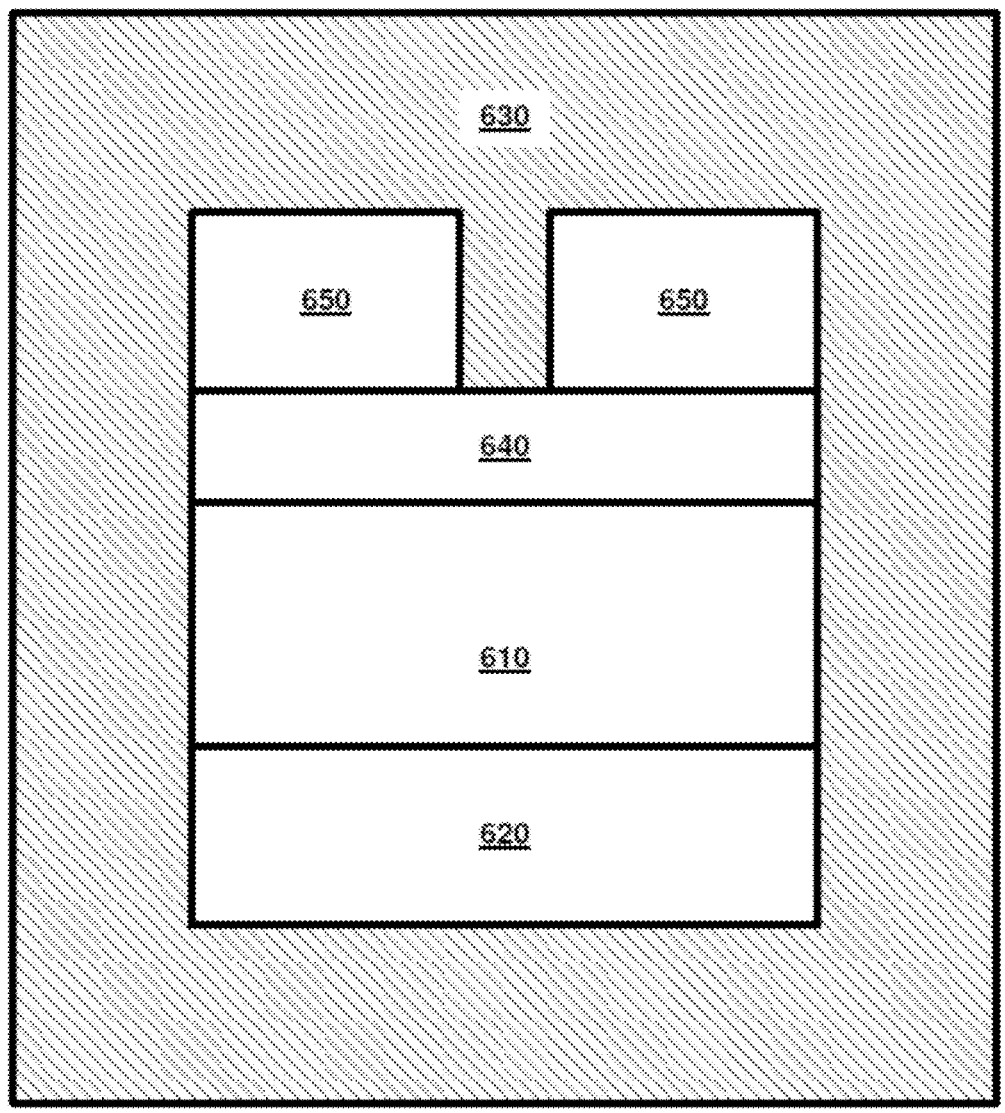
FIG. 6 is a schematic illustration of an embodiment of an apparatus comprising a substrate comprising a scintillating material.

FIG. 6 depicts an embodiment 600 comprising one or more substrates 610 comprising a scintillating material. Scintillating material is useful, for example, in embodiments where the apparatus 600 detects energy emitted as a result of one or more nuclear reactions. In at least some of these embodiments, the scintillating material converts energy emitted as a result of one or more nuclear reactions into electromagnetic radiation and emits the electromagnetic radiation. The electromagnetic radiation emitted is then converted into electrical and/or thermal energy, and can be used to provide power to one or more circuits, one or more batteries, or both.

In certain embodiments, the scintillating material comprises one or more organic materials. In other embodiments, the scintillating material comprises one or more inorganic materials, such as cesium iodide. The scintillating material also may be doped with one or more scintillator dopants. In one configuration, the scintillating material is cesium iodide doped with thallium. Using a halogenated scintillator can contribute to the desired luminosity and/or peak photon wavelength.

It may be beneficial for the apparatus 600 to contour to another surface such, as a body to which the apparatus can be attached. Accordingly, flexible scintillating materials may be selected, such as polymeric materials. In certain embodiments it may be beneficial for apparatus 600 to have a more durable construction, and hence more durable scintillating materials are selected.

The apparatus 600 further comprises a radiation source 620. Radiation source 620 is positioned adjacent to the substrates 610. Apparatus 600 also includes at least one optically reflective material 630. The radiation source 620, in some embodiments, emits α-particles. Exemplary radiation sources include polonium-210, plutonium-238, and/or americium-241. These features of the apparatus 600 are beneficial in embodiments where the apparatus converts energy from nuclear reactions to electrical energy. The radiation source 620 emits energy as a result of nuclear decay. Any suitable scintillating material can be used with this embodiment. Certain exemplary embodiments comprise at least one metal sulfide, for example, zinc sulfide, and may further comprise at least one dopant, for example, silver. α-particles emitted by the radiation source 620 impinge on the scintillating material, which then emits electromagnetic radiation. Photodetecting material 640 receives the electromagnetic radiation and transfers electrical and/or thermal energy in response to receiving the electromagnetic radiation to one or more electrodes 650. Optically reflective material 630 surrounds at least a portion of the electrodes 650, the photodetecting materials 640, the substrates 610, the radiation source 620, or combinations thereof. Optically reflective material 630 is positioned to reflect electromagnetic radiation towards the photodetecting materials 640. Similarly, the optically reflective material 630 is positioned to absorb and/or reflect energy emitted by the radiation source 620. This feature limits and/or prevents exposure to the energy emitted by the radiation source outside the apparatus 600.

Figure 7:
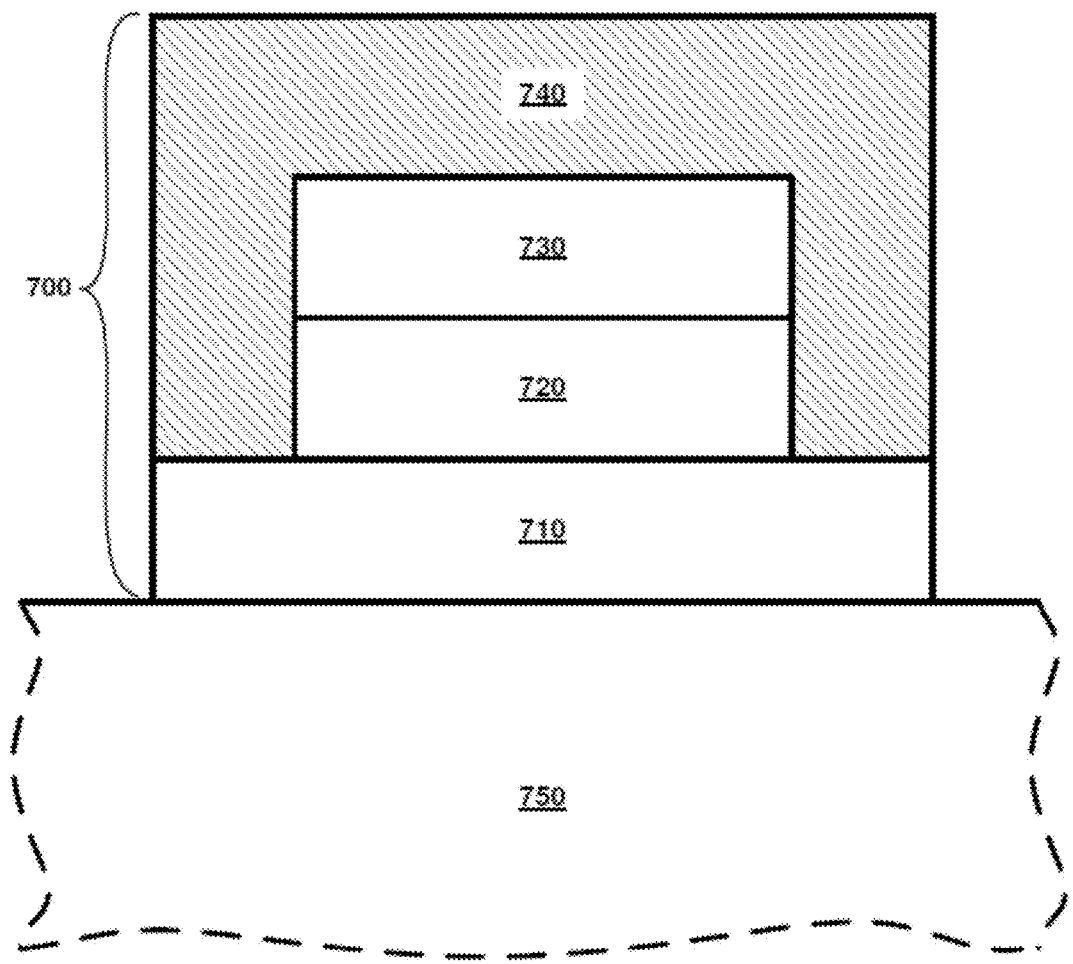
FIG. 7 is a schematic illustration of an embodiment of an apparatus comprising a flexible substrate material to allow the apparatus to conform to a body for use in accordance with embodiments of the present invention.

FIG. 7 depicts apparatus embodiment 700 comprising substrate 710, photodetecting material 720, electrodes 730, and optically reflective materials 740. Substrate 710 comprises one or more flexible materials. The flexible materials provide structural support, but also can contour to a body 750. The flexible material enables apparatus 700 to remain in contact with and/or adjacent to the body 750 in circumstances where the body 750 flexes and/or changes shape. For example, body 750 may emit electromagnetic radiation, such as infrared electromagnetic radiation radiated by mammals, including humans. Photodetecting material 720 detects the electromagnetic radiation emitted by the body, converts the electromagnetic radiation to electrical and/or thermal energy, and transfers the electrical and/or thermal energy to electrodes 730. Electrodes 730 then transmit the electrical and/or thermal energy to, for example, one or more circuits, one or more batteries, or both.

Figure 8:
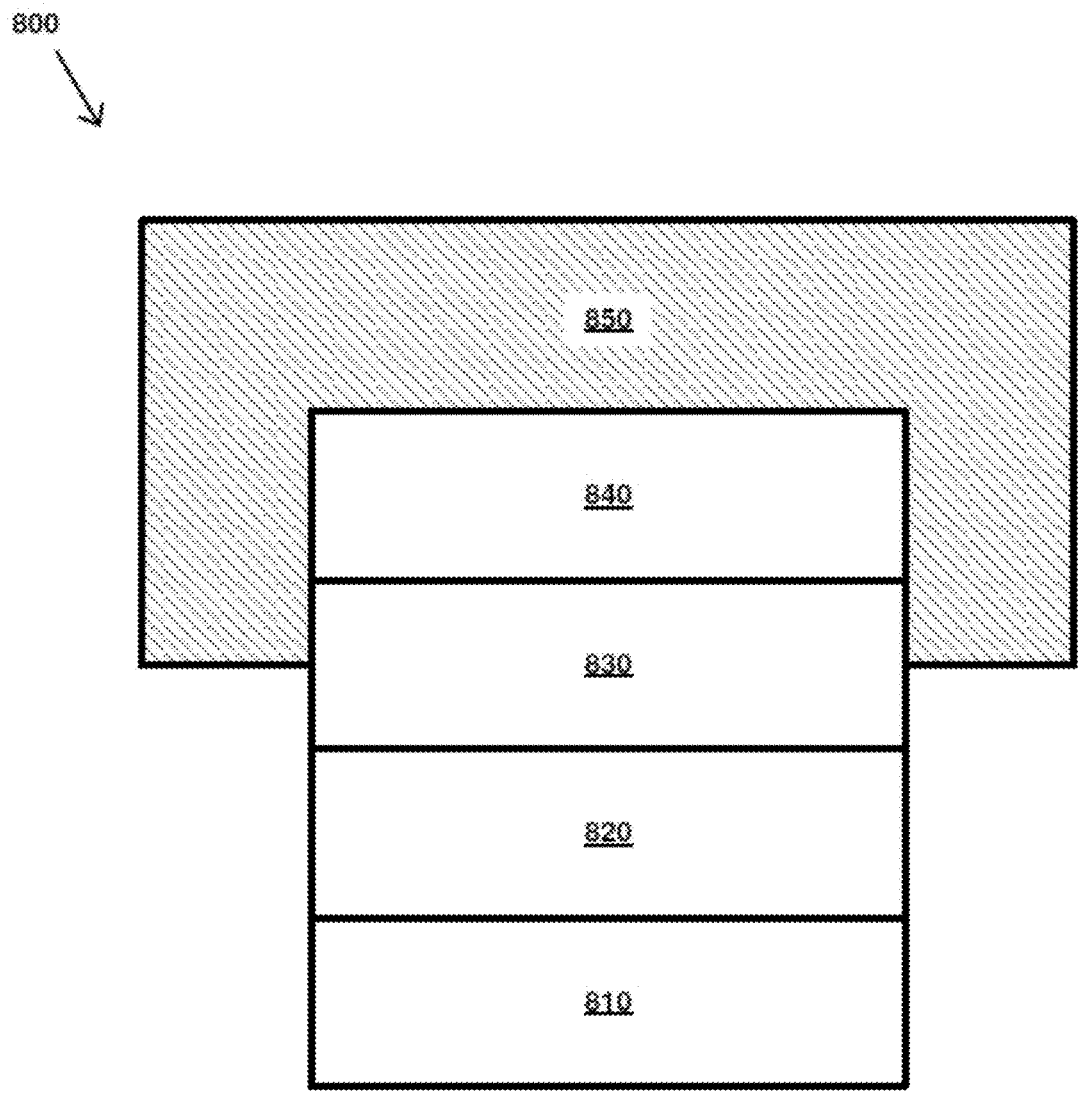
FIG. 8 is a schematic illustration of an embodiment of an apparatus comprising one or more photoemitting materials surrounded by an optically reflective material.

FIG. 8 depicts apparatus embodiment 800 comprising a semiconducting material 810 adjacent to a photodetecting material 820, electrodes 830, and photoemitting materials 840. Additionally, an optically reflective material 850 may surround at least a portion of the semiconducting materials 810, the photodetecting material 820, the electrodes 830, and/or the photoemitting materials 840. In the embodiment depicted by FIG. 8, the optically reflective materials 850 surround the photoemitting materials 840 and at least a portion of the electrodes 830.

The configuration depicted in FIG. 8 can be useful for providing multiple output signals. For example, in one embodiment the semiconducting material 810 is photosensitive. Photosensitive semiconducting material 810 detects electromagnetic radiation and emits one or more signals corresponding to the detected electromagnetic radiation. Such embodiments include those where the photosensitive semiconducting materials 810 comprise a photon waveguide. Furthermore, in some specific examples, the photon waveguide comprises silicon.

Figure 9:
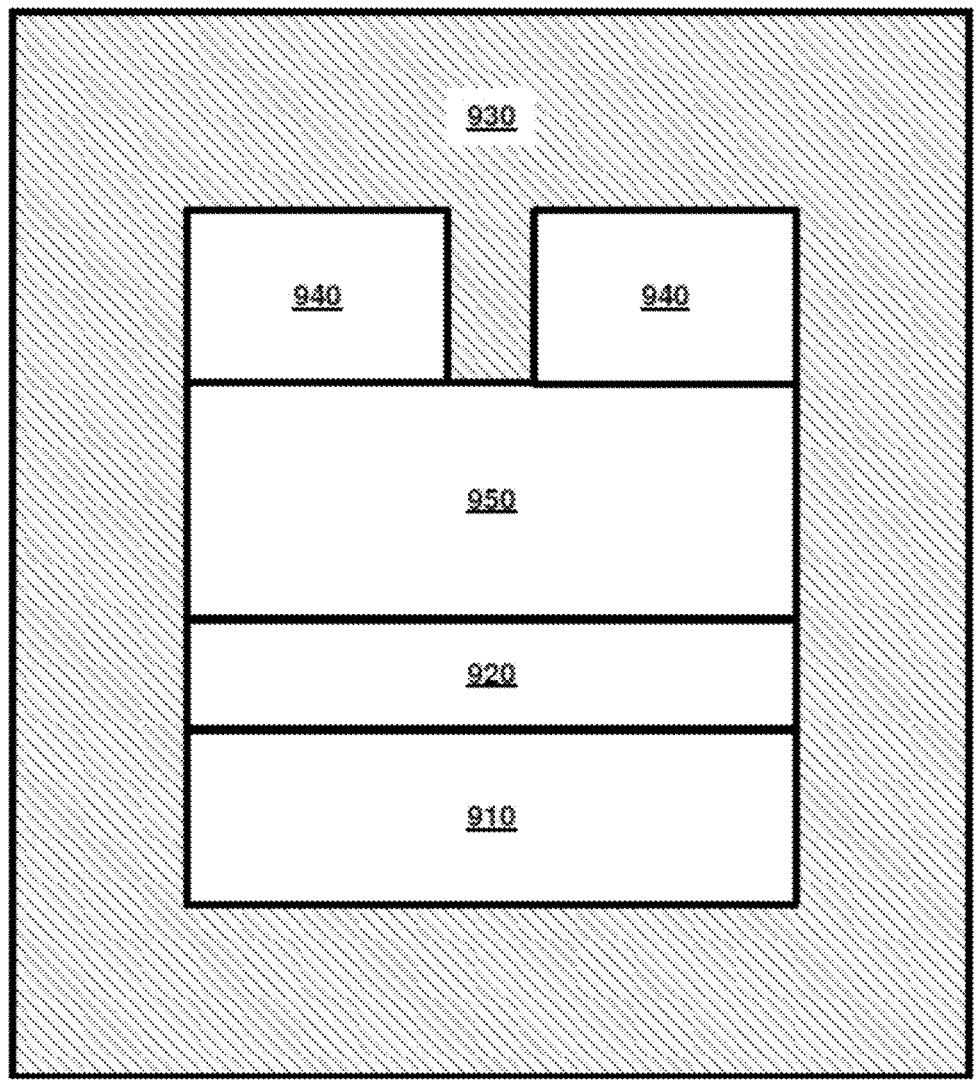
FIG. 9 is a schematic illustration of an embodiment of an apparatus comprising a radiation mediator.

FIG. 9 depicts apparatus 900 comprising a radiation mediator 910, substrate 920, optically reflective materials 930, electrodes 940, and photodetecting materials 950. The radiation mediator 910 emits a second radiation type in response to receiving a first radiation type. Radiation mediator 910 is positioned to transmit the first and/or second radiation types to the substrate 920. In some embodiments, substrate 920 comprises a scintillating material. This configuration is particularly advantageous for enabling the apparatus 900 to detect radiation types that the scintillating material does not and/or cannot detect.

Additionally, optically reflective material 930, electrode 940, photodetecting material 950, substrate 920, or combinations thereof, may have complementary surfaces, such as planar or curvilinear surfaces. Complementary surfaces also may have complementary molecular structures, such as complimentary crystal structures, with one particular example being complimentary hexagonal crystal structures.

V. Method for Making

The present application also discloses a method for making embodiments of the apparatus. A suitable substrate is selected. The substrate typically comprises a photosensitive material, a flexible material, and/or a semiconducting material. At least one photodetecting material is then positioned on the substrate; one or more electrodes are positioned adjacent to the photodetecting materials; and one or more optically reflective materials are positioned adjacent to the electrodes and/or substrates. At least one optically reflective material is electrically insulating, and is placed adjacent to the electrodes. In some embodiments, the method further comprises placing a radiation source material adjacent to the substrate and/or at least one of the optically reflective materials. The method may also comprise placing a radiation mediator sufficiently adjacent to the scintillator to transmit a first and/or second radiation type to the scintillator. In such embodiments, the radiation mediator emits a second radiation type in response to receiving a first radiation type.

The photodetecting materials can be positioned on the substrate(s) by any suitable method now known or hereafter discovered. For example, the photodetecting materials may be deposited on the substrate by chemical vapor deposition, physical vapor deposition, or both. In another embodiment, the method comprises growing the photodetecting materials on a growth substrate and transferring the photodetecting materials to the substrate. Electrodes are placed adjacent to the photodetecting materials in a similar manner. The electrodes may be deposited on the photodetecting materials, the substrates, or both, or adjacent to the photodetecting materials, by chemical vapor deposition and/or physical vapor deposition.

As described above with regard to FIGS. 1-9, it can be beneficial to include one or more signal detectors. Accordingly, the method for making the apparatus may also comprise connecting a signal detector to the electrodes. Similarly, the configuration of the electrodes may be a consideration. Some embodiments comprise interdigitating the electrodes and/or spacing the electrodes sufficiently apart to prevent conduction of electrical energy between the interdigitated electrodes.

The apparatus embodiments described above may benefit from particular configurations of the photodetecting materials, electrodes, and/or substrates relative to one another. For example, the method of making may comprise patterning the photodetecting material on the substrate to form a repeating pattern of alternating first and second regions. The first region comprises the photodetecting materials deposited on the substrate, and the second region comprises the substrate.

VI. Method for Using

Exemplary embodiments of a method for using the apparatus also are disclosed, comprising providing an apparatus and using the apparatus for a particular purpose. For example, the method may comprise positioning an apparatus and a radiation source sufficiently adjacent to each other for the apparatus to detect radiation emitted by the radiation source. These embodiments can be useful for identifying sources of radiation and/or providing electrical energy to a circuit.

Some of the embodiments described above employ a signal detector having a user interface. Using the apparatus may comprise reading one or more electrical signal values from the signal detector user interface. In embodiments where the user interface can accept user input, using the apparatus further comprises entering instructions into the signal detector using the user interface. The instructions correspond to one or more signal detector operations performed by the signal detector.

Some of the embodiments described above can be used to provide power to one or more circuits and/or one or more batteries. With regard to such embodiments, using the apparatus also comprises connecting the apparatus to a circuit comprising one or more batteries and/or one or more electronic devices. In such embodiments, the apparatus provides an electrical current to the batteries and/or electronic devices.

The apparatus also can be used to convert energy from infrared electromagnetic radiation. With reference to these embodiments, the apparatus is placed adjacent to an infrared electromagnetic radiation source, such as a vein and/or artery of a mammal, including a human.

VII. Examples

The following example describes particular features of exemplary embodiments. A person of ordinary skill in the art will understand that the scope of the invention is not limited to the particular features exemplified.

Example 1

A scintillating crystal was selected and graphene was deposited on the scintillating crystal. A palladium electrode and s titanium electrode were interdigitated and placed over the graphene and adjacent to the scintillating crystal. The electrodes, the graphene, and the scintillating crystal were surrounded with a polytetrafluoroethylene coating. A strontium-90/yttrium-90 β radionuclide-emitter was theoretically positioned adjacent to the scintillating crystal. The scintillating crystal emitted photons, generally considered to be about 65,000 photons for each MeV of β energy deposited. The emitted photons had an average wavelength of about 500 nanometers. Of those photons, about half, or 32,500 per β radionuclide interaction, reached the graphene. The graphene absorbed some portion of the photons, such as about five percent, that impinged on the graphene. For each photon the graphene absorbed, electrons were collected by the electrodes, resulting in 11-microAmps of current.

The electrodes can be connected to an external bias as well. Furthermore, because the electrodes comprise different materials, the photothermoelectric effect can be utilized to create a detectable electrical potential gradient. While the photothermoelectric effect does not create extra electrons for collection in the same way that electrons from the graphene can be collected, it helps in collecting the other electrons by utilizing an electric potential to aid in collecting electrons.

Example 2

An apparatus was made to establish the usefulness embodiments according to FIG. 6 for generating current from radionuclide energy. Gallium arsenide was deposited on a plastic scintillator, electrodes were coupled to the gallium arsenide, and a strontium-90/yttrium-90 β radionuclide-emitter was positioned adjacent to the plastic scintillator. Various electric potentials ranging from about 0 to 25 Volts were applied across the electrodes. A net current of about 1.5 nanoamps was observed at all applied potentials. A reflective coating can be positioned around the apparatus to increase the net current.

Example 3

An apparatus was made to establish the usefulness of embodiments according to FIG. 1. Graphene was deposited on a quartz crystal, electrodes were coupled to the graphene, and an electric potential of about 1 Volt was applied across the electrodes. The apparatus was exposed to infrared electromagnetic radiation in the form of hot air and infrared electromagnetic radiation emitted by a human hand. A 480 microamp current was observed. A reflective coating can be positioned as a coating around the electrodes and/or graphene. Such a configuration may be useful in converting infrared electromagnetic radiation emitted by a human for powering a battery and/or circuit.

In view of the many possible embodiments to which the principles of the disclosed invention may be applied, it should be recognized that the illustrated embodiments are only preferred examples of the invention and should not be taken as limiting the scope of the invention. Rather, the scope of the invention is defined by the following claims. We therefore claim as our invention all that comes within the scope and spirit of these claims.

We claim:

1. An apparatus, comprising:
a substrate;
an electrode; and
a photodetecting material comprising at least two layers, the at least two layers comprising an electrically conductive layer positioned adjacent to the electrode and a photosensitive layer positioned adjacent to the substrate, the photodetecting material comprising graphene and a second material selected from a transition metal oxide (TMO), a transition metal arsenide, or combinations thereof.

2. The apparatus according to claim 1 where the apparatus is a radiation detector and further comprises a scintillating material.

3. The apparatus according to claim 2 where the scintillating material is selected from inorganic scintillators, glass scintillators, organic scintillators, polymeric scintillators, or combinations thereof.

4. The apparatus according to claim 3 where the inorganic scintillator is selected from NaI(Tl), CsI(Tl), CsI(Na), CsI (pure), CsF, KI(Tl), LiI(Eu), BaF$_2$, CaF$_2$(Eu), ZnS(Ag), CaWO$_4$, CdWO$_4$, YAG(Ce) (Y$_3$Al$_5$O$_{12}$(Ce)), GSO, LSO, LaCl$_3$(Ce), LaBr$_3$(Ce), Lu$_{1.8}$Y$_{0.2}$SiO$_5$(Ce), BGO.

5. The apparatus according to claim 1 where the photodetecting material comprises gallium arsenide (GaAs).

6. The apparatus according to claim 1, comprising interdigitated electrodes.

7. The apparatus according to claim 1 comprising two electrodes having different Seebeck coefficients.

8. The apparatus according to claim 1, further comprising a signal detector to detect one or more electrical signals.

9. The apparatus according to claim 8, further comprising a user interface to display one or more electrical signal values corresponding to an electrical signal transmitted by the electrodes to the signal detector and/or to accept input from a user specifying one or more signal detector operations.

10. The apparatus according to claim 1, wherein at least one photodetecting layer has a single-atom and/or single-molecule thickness.

11. The apparatus according to claim 1, wherein at least one photodetecting layer has multiple-atoms and/or multiple-molecules thickness.

12. The apparatus according to claim 1, wherein the substrate comprises one or more flexible materials.

13. The apparatus according to claim 1, wherein the substrate comprises a semiconductor.

14. The apparatus of claim 1, wherein the substrate is a scintillating substrate.

15. The apparatus of claim 1, further comprising an insulating, optically reflective material operatively positioned adjacent to or around the substrate.

16. The apparatus according to claim 15, wherein the optically reflective material comprises an inner surface and an outer surface, and wherein the inner surface is optically reflective to reflect electromagnetic radiation towards the photodetecting material.

17. The apparatus according to claim 15, wherein the apparatus comprises at least two different optically reflective materials to reflect electromagnetic radiation towards the photodetecting material.

18. The apparatus according to claim 15, wherein the optically reflective material surrounds at least a portion of the electrode, the photodetecting material, the substrate, or combinations thereof.

19. The apparatus of claim 1, wherein the photodetecting material further comprises a transition metal dichalcogenide.

20. A method for making an apparatus, comprising:
providing a photodetecting material comprising at least two layers, the at least two layers comprising an electrically conductive material positioned adjacent to the electrode and a photosensitive material positioned adjacent to the substrate, the photodetecting material comprising graphene and a second material selected from a transition metal oxide (TMO), a transition metal arsenide, or combinations thereof;
positioning the photosensitive material on a substrate; and
positioning electrodes operatively adjacent to the electrically conductive material.

21. The method according to claim 20 further comprising positioning a scintillating material operatively adjacent to the photodetecting material.

22. The method according to claim 21, further comprising positioning a radiation source operatively adjacent to the scintillating material.

23. The method according to claim 21, further comprising placing a radiation mediator sufficiently adjacent to the scintillating material to transmit a first and/or second radiation type to the scintillating material, wherein the radiation mediator emits the second radiation type in response to receiving the first radiation type.

24. A method, comprising:
providing an apparatus comprising a substrate, an electrode, and a photodetecting material comprising at least two layers, the at least two layers comprising an electrically conductive layer positioned adjacent to the electrode, and a photosensitive layer positioned adjacent to the substrate, the photodetecting material comprising graphene and a second material selected from a transition metal oxide (TMO), a transition metal arsenide, or combinations thereof; and
using the apparatus.

25. The method according to claim 24 wherein the apparatus further comprises a scintillating material.

26. The method according to claim 25, further comprising positioning the apparatus sufficiently near a radiation source to detect radiation emitted by the radiation source.

27. The method according to claim 24 wherein the apparatus includes an internal radiation source, and further comprising connecting the apparatus to a circuit comprising one or more batteries and/or one or more electronic devices, wherein the apparatus provides an electrical current to the batteries and/or electronic devices.

28. The method of claim 24, where the apparatus comprises a flexible substrate, and the method further comprises placing the apparatus adjacent to an infrared electromagnetic radiation source.

29. The method according to claim 28 wherein a mammal is the infrared electromagnetic radiation source.

* * * * *